(12) United States Patent
Inuzuka

(10) Patent No.: US 11,069,405 B2
(45) Date of Patent: Jul. 20, 2021

(54) SEMICONDUCTOR MEMORY DEVICE

(71) Applicant: Kioxia Corporation, Tokyo (JP)

(72) Inventor: Yuki Inuzuka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/811,209

(22) Filed: Mar. 6, 2020

(65) Prior Publication Data

US 2021/0082500 A1    Mar. 18, 2021

(30) Foreign Application Priority Data

Sep. 12, 2019 (JP) .............................. JP2019-166252

(51) Int. Cl.
*G11C 11/00* (2006.01)
*G11C 13/00* (2006.01)
*H01L 45/00* (2006.01)
*H01L 27/24* (2006.01)

(52) U.S. Cl.
CPC ........ *G11C 13/003* (2013.01); *H01L 27/2481* (2013.01); *H01L 45/141* (2013.01); *G11C 2213/71* (2013.01)

(58) Field of Classification Search
CPC ......... H01L 2924/0002; H01L 2924/00; H01L 2924/00012; H01L 23/5226; H01L 23/528; H01L 21/76816; H01L 21/76877; H01L 27/0207; H01L 21/76819; H01L 27/11565; H01L 27/1157; H01L 27/11582; H01L 2224/16225; G11C 13/0004; G11C 13/0023; G11C 13/0026; G11C 13/0028; G11C 13/003; G11C 13/004; G11C 13/0069; G11C 2013/0045; G11C 2013/0078; G11C 2213/71; G11C 2213/77
USPC ................... 716/119, 126, 118, 122, 130, 55
See application file for complete search history.

(56) References Cited

U.S. PATENT DOCUMENTS

| | | | |
|---|---|---|---|
| 9,245,629 B2 | 1/2016 | Samachisa | |
| 9,444,046 B2 | 9/2016 | Pio | |
| 10,090,314 B2 * | 10/2018 | Lee | ....................... H01L 23/544 |
| 2019/0103440 A1 | 4/2019 | Inaba | |
| 2020/0303004 A1 * | 9/2020 | Kawasumi | .......... H01L 45/1233 |

* cited by examiner

*Primary Examiner* — Thong Q Le
(74) *Attorney, Agent, or Firm* — Foley & Lardner LLP

(57) ABSTRACT

A semiconductor memory device of an embodiment has stacked semiconductor memories, each semiconductor memory including first lines intersecting with second lines, and resistive change elements each disposed between one of the first lines and one of the second lines. In two of the semiconductor memories adjacent to each other in the stacking direction, either two of the first lines or two of the second lines are disposed along and in contact with each other. A first contact electrically connected to the second line of the uppermost semiconductor memory passes through a region between the second lines of each of the semiconductor memories located below the uppermost semiconductor memory, and a second contact electrically connected to the second line of each of the semiconductor memories located at an intermediate level passes through a region between the second lines of each of the semiconductor memories located below the intermediate level.

14 Claims, 4 Drawing Sheets

SEMICONDUCTOR MEMORY DEVICE

CROSS REFERENCE TO RELATED APPLICATIONS

This application is based upon and claims the benefit of priority from the prior Japanese Patent Application No. 2019-166252, filed on Sep. 12, 2019, the entire contents of which are incorporated herein by reference.

FIELD

Embodiments described herein relate generally to semiconductor memory devices.

BACKGROUND

Semiconductor memories including resistive change elements such as phase-change memory elements (hereinafter also referred to as "phase-change material (PCM) elements") serving as storage elements disposed in intersections of wirings are known.

Such semiconductor memories may be stacked and integrated. In such a case, however, the chip size may be increased.

DETAILED DESCRIPTION

Figure 1:
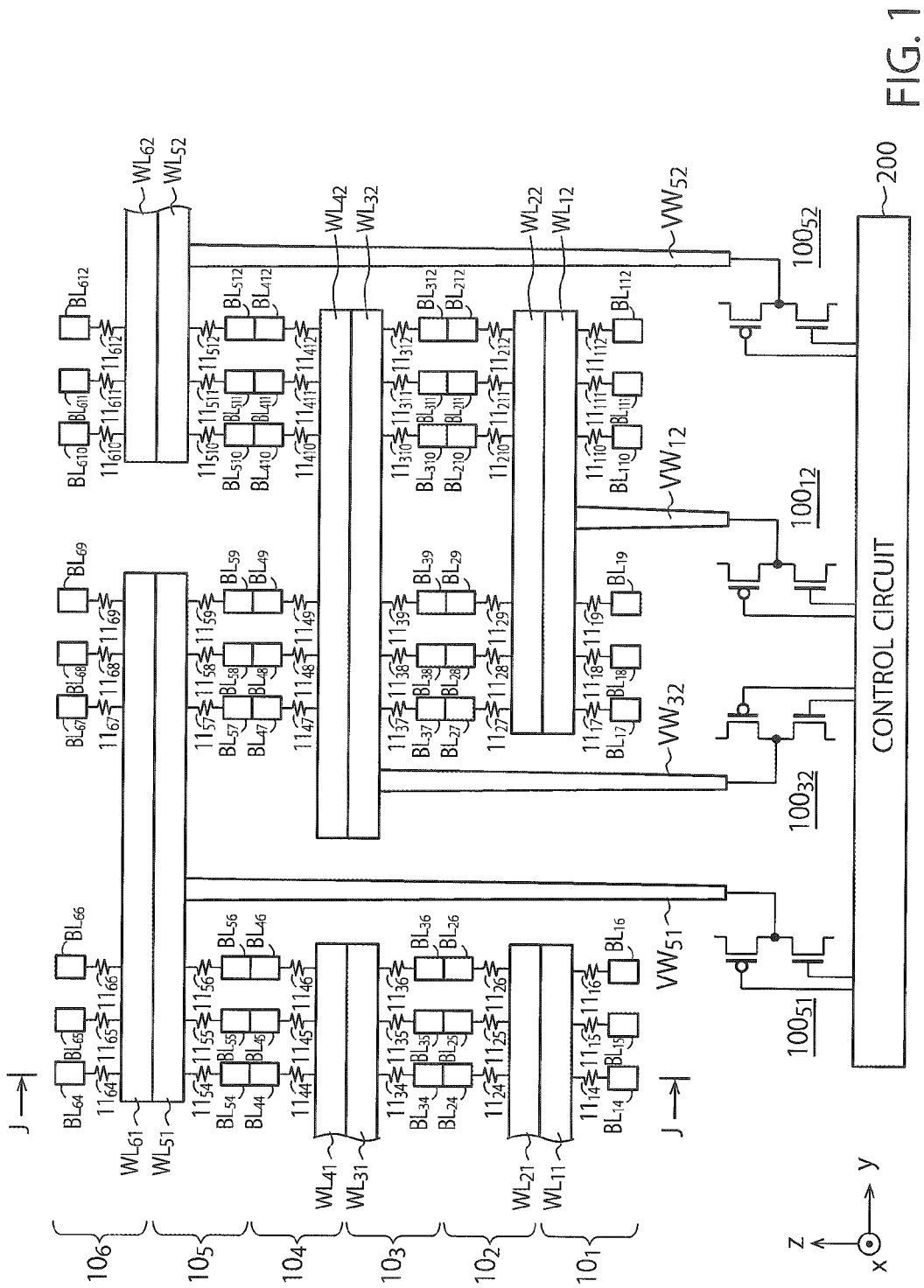
FIG. 1 is a cross-sectional view of a semiconductor memory device according to a first embodiment.

In a semiconductor memory including resistive change elements such as a phase-change memory elements (hereinafter also referred to as phase-change material (PCM) elements) serving as storage elements, a wiring (for example, a first bit line) intersects with another wiring (for example, a first word line) in a stacking manner, a second bit line is disposed to intersect with the first word line, a second word line is disposed to intersect with the second bit line, and each resistive change element is disposed at an intersection of a bit line and a word line. If wirings are further stacked, and a third bit line is disposed to intersect with the second word line and a third word line is disposed to intersect with the third bit line, a contact that electrically connects the third word line and a driving circuit for driving the third word line disposed on the lowest level of the semiconductor memory may contact the first word line or the second word line which is disposed below the third word line. This problem may be solved by dividing the word line that may possibly contact the contact. In such a case, however, another wiring that connects the divided word lines is needed, which increases the chip size. If the divided word lines are not connected by using another wiring, additional transistors may be needed to drive the divided word lines, which also increases the chip size.

A semiconductor memory capable of preventing an increase in chip size if having an increased number of layers will then be described by referring to embodiments below.

A semiconductor memory device according to an embodiment includes: a plurality of first wirings disposed at a first level and extending in a first direction; a second wiring and a third wiring disposed at a second level, a position of which in a second direction intersecting with the first direction is different from that of the first level, the second wiring and the third wiring extending in a third direction that intersects with the first direction and the second direction, and being separated from each other; a plurality of first resistive change elements each including a first terminal and a second terminal and disposed between one of the first wirings and one of the second wiring and the third wiring, the first terminal being electrically connected to the one of the first wirings, and the second terminal being electrically connected to the one of the second wiring and the third wiring; a fourth wiring disposed to be in contact with a face of the second wiring opposite to the first wirings and extending in the third direction; a fifth wiring disposed to be in contact with a face of the third wiring opposite to the first wirings, extending in the third direction, and separated from the fourth wiring; a plurality of sixth wirings disposed at a third level and extending in the first direction, the second level being between the first level and the third level; a plurality of second resistive change elements each including a third terminal and a fourth terminal and disposed between one of the fourth wiring and the fifth wiring and one of the sixth wirings, the third terminal being electrically connected to the one of the fourth wiring and the fifth wiring, and the fourth terminal being electrically connected to the one of the sixth wirings; a plurality of seventh wirings disposed to correspond to the sixth wirings and extending in the first direction, each of the seventh wirings being disposed to be in contact with a face of corresponding one of the sixth wirings opposite to the second resistive change elements; an eighth wiring and a ninth wiring disposed at a fourth level, extending in the third direction, and separated from each other, the third level being between the fourth level and the second level; a plurality of third resistive change elements each including a fifth terminal and a six terminal and disposed between one of the seventh wirings and one of the eighth wiring and the ninth wiring, the fifth terminal being electrically connected to the one of the seventh wirings, and the six terminal being electrically connected to the one of the eighth wiring and the ninth wiring; a tenth wiring disposed to be in contact with a face of the eighth wiring opposite to the seventh wirings and extending in the third direction; an eleventh wiring disposed to be in contact with a face of the ninth wiring opposite to the seventh wirings and extending in the third direction, and separated from the tenth wiring; a plurality of twelfth wirings disposed at a fifth level and extending in the first direction, the fourth level being between the fifth level and the third level; a plurality of fourth resistive change elements each including a seventh terminal and an eighth terminal and disposed between one of the tenth wiring and the eleventh wiring and one of the twelfth wirings, the seventh terminal being electrically connected to the one of the tenth wiring and the eleventh wiring, and the eighth terminal being electrically connected to the one of the twelfth wirings; a plurality of thirteenth wirings disposed to correspond to the twelfth wirings and extending in the first direction, each of the thirteenth wirings disposed to be in contact with a face of corresponding one of the twelfth wirings opposite to the fourth resistive change elements; a fourteenth wiring and a fifteenth wiring disposed at a sixth level, extending in the third direction, and separated from each other, the fifth level being between the sixth level and the fourth level, a region between the tenth wiring and the eleventh wiring, a region between the eighth wiring and the ninth wiring, a region between the fourth wiring and the fifth wiring, and a region between the second wiring and the third wiring being located at positions in the second direction from a portion of the fourteenth wiring; a plurality of fifth resistive change elements each including a ninth terminal and a tenth terminal and disposed between one of the thirteenth wirings and one of the fourteenth wiring and the fifteenth wiring, the ninth terminal being electrically connected to the one of the thirteenth wirings, and the tenth terminal being electrically connected to the one of the fourteenth wiring and the fifteenth wiring; a sixteenth wiring disposed to be in contact with a face of the fourteenth wiring opposite to the thirteenth wirings and extending in the third direction; a seventeenth wiring disposed to be in contact with a face of the fifteenth wiring opposite to the thirteenth wirings and extending in the third direction, and separated from the sixteenth wiring; a plurality of eighteenth wirings disposed at a seventh level and extending in the first direction, the sixth level being between the seventh level and the fifth level; a plurality of sixth resistive change elements each including an eleventh terminal and a twelfth terminal and disposed between one of the sixteenth wiring and the seventeenth wiring and one of the eighteenth wirings, the eleventh terminal being electrically connected to the one of the sixteenth wiring and the seventeenth wiring, and the twelfth terminal being electrically connected to the one of the eighteenth wirings; a first contact electrically connected to a portion of the third wiring; a second contact electrically connected to an end of the ninth wiring on a side of the eighth wiring, and passing through the region between the fourth wiring and the fifth wiring and the region between the second wiring and the third wiring; and a third contact electrically connected to the portion of the fourteenth wiring, and passing through the region between the tenth wiring and the eleventh wiring, the region between the eighth wiring and the ninth wiring, the region between the fourth wiring and the fifth wiring, and the region between the second wiring and the third wiring.

First Embodiment

Figure 2:
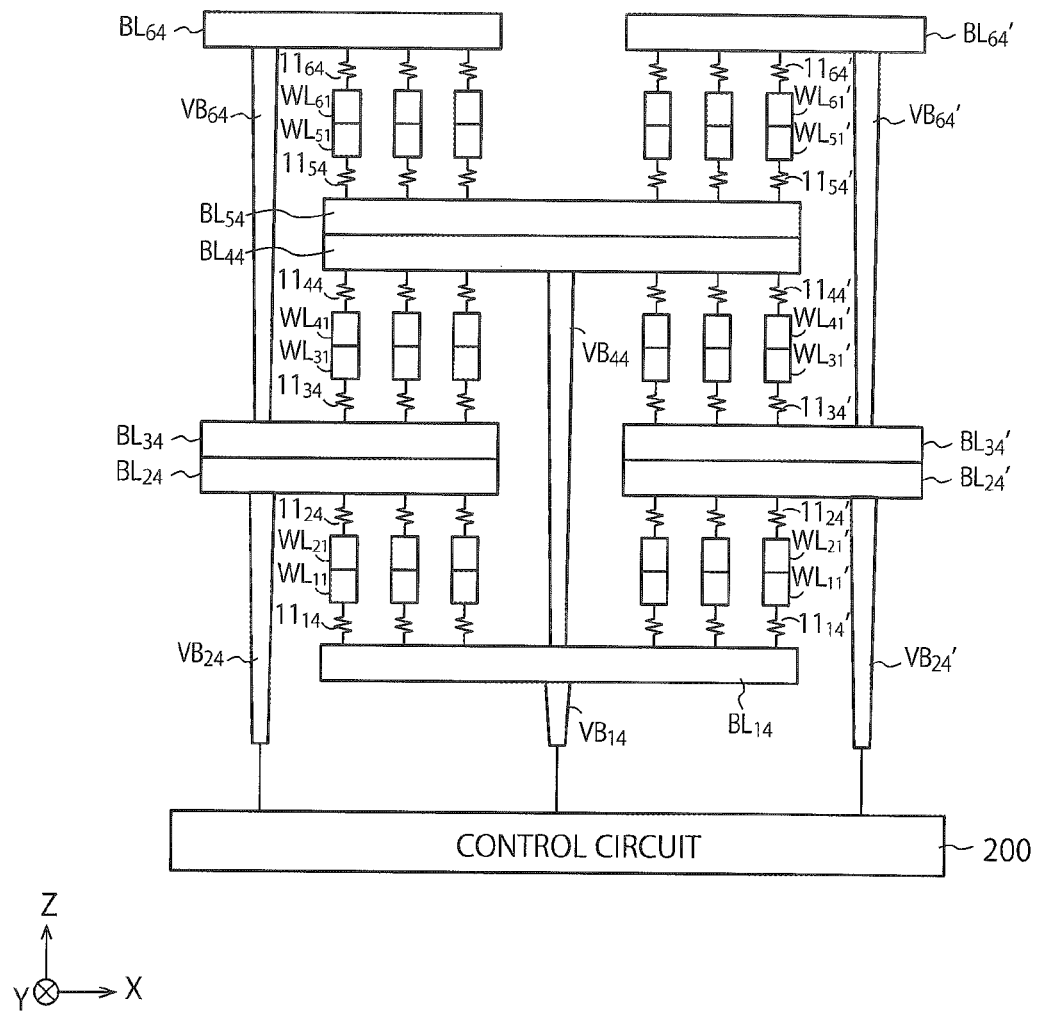
FIG. 2 is a cross-sectional view of the semiconductor memory device according to the first embodiment.

A semiconductor memory device according to a first embodiment will be described with reference to FIGS. 1 and 2. FIG. 1 is a cross-sectional view of the semiconductor memory device according to the first embodiment. The cross-sectional view shown in FIG. 1 shows a z-y plane. FIG. 2 shows a cross-sectional view taken along line J-J shown in FIG. 1.

The semiconductor memory device according to the first embodiment has a structure obtained by sequentially stacking a cross-point semiconductor memory $10_1$, a cross-point semiconductor memory $10_2$, a cross-point semiconductor memory $10_3$, a cross-point semiconductor memory $10_4$, a cross-point semiconductor memory $10_5$, and a cross-point semiconductor memory $10_6$. In the following descriptions, each memory cell of the respective semiconductor memories has a resistive change element serving as a storage element. The resistive change element is a PCM element in the following descriptions, but not limited thereto.

The semiconductor memory $10_1$ includes a plurality of (nine in FIG. 1) bit lines $BL_{14}$ to $BL_{112}$, a plurality of (nine in FIG. 1) PCM elements $11_{14}$ to $11_{112}$, and a plurality of (two in FIG. 1) word lines $WL_{11}$ and $WL_{12}$. The bit lines $BL_{14}$ to $BL_{112}$, the PCM elements $11_{14}$ to $11_{112}$, and the word lines $WL_{11}$ and $WL_{12}$ are disposed at different levels in a z direction (the vertical direction in FIG. 1).

The bit lines $BL_{14}$ to $BL_{112}$ extend in a direction perpendicular to the plane of FIG. 1 (x direction). The word lines $WL_{11}$ and the word line $WL_{12}$ extend in a lateral direction in FIG. 1 (y direction), and separated from each other. In other words, there is a space between the word line $WL_{11}$ and the word line $WL_{12}$. One end of the PCM element $11_{1j}$ is electrically connected to the bit line $BL_{1j}$ (j=4, . . . , 12). The other end of each of the PCM elements $11_{14}$ to $11_{16}$ is electrically connected to the word line $WL_{11}$. The other end of each of the PCM elements $11_{17}$ to $11_{112}$ is electrically connected to the word line $WL_{12}$. The description "A and B are electrically connected" herein means that A and B may be directly connected or indirectly connected via a conductive member disposed between A and B.

The semiconductor memory $10_2$ includes a plurality of (two in FIG. 1) word lines $WL_{21}$ and $WL_{22}$, a plurality of (nine in FIG. 1) bit lines $BL_{24}$ to $BL_{212}$, and a plurality of (nine in FIG. 1) PCM elements $11_{24}$ to $11_{212}$. The word lines $WL_{21}$ and $WL_{22}$, the PCM elements $11_{24}$ to $11_{212}$, and the bit lines $BL_{24}$ to $BL_{212}$ are disposed at different levels in the z direction (the vertical direction in FIG. 1).

The word line $WL_{21}$ and the word line $WL_{22}$ extend in the lateral direction in FIG. 1 (y direction), and separated from each other. The word line $WL_{21}$ and the word line $WL_{22}$ are disposed to be in electrical contact with the top faces of the word line $WL_{11}$ and the word line $WL_{12}$ of the semiconductor memory $10_1$, respectively. The lengths of the word line $WL_{21}$ and the word line $WL_{22}$ in the y direction are substantially the same as the lengths of the word line $WL_{11}$ and the word line $WL_{12}$ in the y direction, respectively. The description "A and B are in electrical contact with each other" herein means that A and B may be electrically in direct contact with each other or in indirect contact with each other with a conductive member being disposed therebetween. There is a space between the word line $WL_{21}$ and the word line $WL_{22}$, like the word line $WL_{11}$ and the word line $WL_{12}$. The bit lines $BL_{24}$ to $BL_{212}$ extend in the direction perpendicular to the plane of FIG. 1 (x direction). One end of each of the PCM elements $11_{24}$ to $11_{26}$ is electrically connected to the word line $WL_{21}$. One end of each of the PCM elements $11_{27}$ to $11_{212}$ is electrically connected to the word line $WL_{22}$. The other end of the PCM element $11_{2j}$ (j=4, . . . , 12) is electrically connected to the bit line $BL_{2j}$.

The semiconductor memory $10_3$ includes a plurality of (nine in FIG. 1) bit lines $BL_{34}$ to $BL_{312}$, a plurality of (nine in FIG. 1) PCM elements $11_{34}$ to $11_{312}$, and a plurality of (two in FIG. 1) word lines $WL_{31}$ and $WL_{32}$. The bit lines $BL_{34}$ to $BL_{312}$, the PCM elements $11_{34}$ to $11_{312}$, and the word line $WL_{31}$, $WL_{32}$ are disposed at different levels in the z direction (the vertical direction in FIG. 1).

The bit lines $BL_{34}$ to $BL_{312}$ extend in the direction perpendicular to the plane of FIG. 1 (x direction). The bit line $BL_{3j}$ (j=4, . . . , 12) is arranged to be in electrical contact with the top face of the bit line $BL_{23}$ of the semiconductor memory $10_2$. The word line $WL_{31}$ and the word line $WL_{32}$ extend in the lateral direction in FIG. 1 (y direction), and separated from each other. In other words, there is a space (region) between the word line $WL_{31}$ and the word line $WL_{32}$. The word line $WL_{31}$ is arranged at substantially the same location as the word line $WL_{11}$ and the word line $WL_{21}$ in the y direction. However, the length of the word line $WL_{31}$ in the y direction is longer than the length of each of the word line $WL_{11}$ and the word line $WL_{21}$ in the y direction to have a portion where a contact (not shown) is connected. The word line $WL_{32}$ is arranged at substantially the same location as the word line $WL_{12}$ and the word line $WL_{22}$ in the y direction. However, the length of the word line $WL_{32}$ in the y direction is longer than the length of each of the word line $WL_{12}$ and the word line $WL_{22}$ in the y direction to have a portion where a contact (not shown) is connected. For example, in FIG. 1, a contact $VW_{32}$ is disposed at a left end (on the word line $WL_{31}$ side) of the word line $WL_{32}$. The "end of a wiring" herein means a region of the wiring that is closer to an adjacent wiring in the wiring extending direction than any of resistive change elements connected to the wiring. Therefore, there are two ends for each wiring. The left end of the word line $WL_{32}$ means an end of the word line $WL_{32}$ on the side of the word line $WL_{31}$ that is arranged to the immediate left of the word line $WL_{32}$ in the y direction.

Therefore, the length in the y direction of the space between the word line $WL_{31}$ and the word line $WL_{32}$ is shorter than the length in the y direction of the space between the word line $WL_{11}$ and the word line $WL_{12}$. One end of the PCM element $11_{3j}$ is electrically connected to the bit line $BL_{3j}$ (j=4, ..., 12). The other end of each of the PCM elements $11_{34}$ to $11_{36}$ is electrically connected to the word line $WL_{31}$. The other end of each of the PCM elements $11_{37}$ to $11_{312}$ is electrically connected to the word line $WL_{32}$.

The semiconductor memory $10_4$ includes a plurality of (two in FIG. 1) word lines $WL_{41}$ and $WL_{42}$, a plurality of (nine in FIG. 1) bit lines $BL_{44}$ to $BL_{412}$, and a plurality of (nine in FIG. 1) PCM elements $11_{44}$ to $11_{412}$. The word lines $WL_{41}$ and $WL_{42}$, the PCM elements $11_{44}$ to $11_{412}$, and the bit lines $BL_{44}$ to $BL_{412}$ are disposed at different levels in the z direction (the vertical direction in FIG. 1).

The word line $WL_{41}$ and the word line $WL_{42}$ extend in the lateral direction in FIG. 1 (y direction), and separated from each other. The word line $WL_{41}$ and the word line $WL_{42}$ are disposed to be in electrical contact with the top faces of the word line $WL_{31}$ and the word line $WL_{32}$ of the semiconductor memory $10_3$, respectively. The lengths of the word line $WL_{41}$ and the word line $WL_{42}$ in the y direction are substantially the same as the lengths of the word line $WL_{31}$ and the word line $WL_{32}$ in the y direction, respectively. Thus, like the word line $WL_{31}$ and the word line $WL_{32}$, there is a space between the word line $WL_{41}$ and the word line $WL_{42}$. The bit lines $BL_{44}$ to $BL_{412}$ extend in the direction perpendicular to the plane of FIG. 1 (x direction). One end of each of the PCM elements $11_{44}$ to $11_{46}$ is electrically connected to the word line $WL_{41}$. One end of each of the PCM elements $11_{47}$ to $11_{412}$ is electrically connected to the word line $WL_{42}$. The other end of the PCM element $11_{4j}$ (j=4, ..., 12) is electrically connected to the bit line $BL_{4j}$.

The semiconductor memory $10_5$ includes a plurality of (nine in FIG. 1) bit lines $BL_{54}$ to $BL_{512}$, a plurality of (nine in FIG. 1) PCM elements $11_{54}$ to $11_{512}$, and a plurality of (two in FIG. 1) word lines $WL_{51}$ and $WL_{52}$. The bit lines $BL_{54}$ to $BL_{512}$, the PCM elements $11_{54}$ to $11_{512}$, and the word lines $WL_{51}$ and $WL_{52}$ are disposed at different levels in the z direction (the vertical direction in FIG. 1).

The bit lines $BL_{54}$ to $BL_{512}$ extend in the direction perpendicular to the plane of FIG. 1 (x direction). The bit line $BL_{5j}$ (j=4, ..., 12) is arranged to be in electrical contact with the top face of the bit line $BL_{4j}$ of the semiconductor memory $10_4$. The word line $WL_{51}$ and the word line $WL_{52}$ extend in the lateral direction in FIG. 1 (y direction), and separated from each other. In other words, there is a space between the word line $WL_{51}$ and the word line $WL_{52}$. The word line $WL_{51}$ is arranged at a location that is different from the location of each of the word line $WL_{31}$ and the word line $WL_{41}$ in the y direction. The word line $WL_{52}$ is arranged at a location that is different from the location of each of the word line $WL_{32}$ and the word line $WL_{42}$ in the y direction. For example, in FIG. 1, the central portion in the y direction of the word line $WL_{51}$ is located above the central portion of the space between word line $WL_{11}$ and the word line $WL_{12}$ (in the z direction). One end of the PCM element $11_{53}$ is electrically connected to the bit line $BL_{5j}$ (j=4, ..., 12). The other end of each of the PCM elements $11_{54}$ to $11_{56}$ is connected to the word line $WL_{51}$. The other end of each of the PCM elements $11_{57}$ to $11_{512}$ is electrically connected to the word line $WL_{52}$.

The semiconductor memory $10_6$ includes a plurality of (two in FIG. 1) word lines $WL_{61}$ and $WL_{62}$, a plurality of (nine in FIG. 1) bit lines $BL_{64}$ to $BL_{612}$, and a plurality of (nine in FIG. 1) PCM elements $11_{64}$ to $11_{612}$. The word lines $WL_{61}$ and $WL_{62}$, the PCM elements $11_{64}$ to $11_{612}$, and the bit lines $BL_{64}$ to $BL_{612}$ are disposed at different levels in the z direction (the vertical direction in FIG. 1).

The word line $WL_{61}$ and the word line $WL_{62}$ extend in the lateral direction in FIG. 1 (y direction), and separated from each other. The word line $WL_{61}$ and the word line $WL_{62}$ are disposed to be in electrical contact with the top faces of the word line $WL_{51}$ and the word line $WL_{52}$ of the semiconductor memory $10_5$, respectively. The lengths of the word line $WL_{61}$ and the word line $WL_{62}$ in the y direction are substantially the same as the lengths of the word line $WL_{51}$ and the word line $WL_{52}$ in the y direction, respectively. Thus, like the word line $WL_{51}$ and the word line $WL_{52}$, there is a space between the word line $WL_{61}$ and the word line $WL_{62}$. The bit lines $BL_{64}$ to $BL_{612}$ extend in the direction perpendicular to the plane of FIG. 1 (x direction). One end of each of the PCM elements $11_{64}$ to $11_{66}$ is electrically connected to the word line $WL_{61}$. One end of each of the PCM elements $11_{67}$ to $11_{612}$ is electrically connected to the word line $WL_{62}$. The other end of the PCM element $11_{6j}$ (j=4, ..., 12) is electrically connected to the bit line $BL_{6j}$.

One end of each of three PCM elements that are not shown is electrically connected to each of the word lines $WL_{21}$, $WL_{31}$, and $WL_{41}$, and the other ends of the PCM elements are electrically connected to bit lines that are not shown. One end of each of three PCM elements that are not shown is electrically connected to each of the word lines $WL_{52}$ and $WL_{62}$, and the other ends of the PCM elements are electrically connected to bit lines that are not shown. Thus, in the semiconductor memory device shown in FIG. 1, one end of each of six PCM elements is electrically connected to each word line. The number of PCM elements electrically connected to each word line may be more than six.

The semiconductor memory device shown in FIG. 1 also includes driving circuits (for example, driving circuits $100_{12}$, $100_{32}$, $100_{51}$, and $100_{52}$) for driving the respective word lines, and a control circuit 200 for controlling the driving circuits. For example, the driving circuit $100_{12}$ is connected to the word line $WL_{12}$ through a contact $VW_{12}$, the driving circuit $100_{32}$ is connected to the word line $WL_{32}$ through a contact $VW_{32}$, the driving circuit $100_{51}$ is connected to the word line $WL_{51}$ through a contact $VW_{51}$, and the driving circuit $100_{52}$ is connected to the word line $WL_{52}$ through a contact $VW_{52}$. Since the word line $WL_{22}$ is arranged to be in contact with the top face of the word line $WL_{12}$, it is driven by the driving circuit $100_{12}$. Since the word line $WL_{42}$ is arranged to be in contact with the top face of the word line $WL_{32}$, it is driven by the driving circuit $100_{32}$. Since the word line $WL_{51}$ is arranged to be in contact with the top face of the word line $WL_{51}$, it is driven by the driving circuit $100_{51}$. Since the word line $WL_{62}$ arranged to be in contact with the top face of the word line $WL_{52}$, it is driven by the driving circuit $100_{52}$. The word lines $WL_{11}$ and $WL_{31}$ are driven by driving circuits, which are not shown, through contacts, which are not shown, either. The contact (not shown) for the word line $WL_{11}$ connects to a portion (for example a central portion) of the word line $WL_{11}$, like the contact for the word line $WL_{12}$. The contact (not shown) for the word line $WL_{31}$ connects to the left end of the word line $WL_{31}$, like the contact for the word line $WL_{32}$. Since the word lines $WL_{21}$ and $WL_{41}$ are in contact with the top faces of the word lines $WL_{11}$ and $WL_{31}$, respectively, they are also driven by the driving circuits that are not shown.

The contact $VW_{12}$ is formed to electrically connect to a portion (for example a central portion) of the word line $WL_{12}$. The contact $VW_{32}$ is formed to electrically connect to the left end (on the side of the word line $WL_{31}$) of the word line $WL_{32}$ and also to the driving circuit $100_{32}$ through the space between the word line $WL_{11}$ and the word line $WL_{12}$. The bit line $BL_{3j}$ connected to the PCM element $11_{3j}$ (j=7, . . . , 12) that is further connected to the word line $WL_{32}$ is stacked on the bit line $BL_{23}$. As a result, the wiring resistance of this portion becomes lower than that of a single wiring. Therefore, the existence of the contact $VW_{32}$ at the end of the word line $WL_{32}$ does not affect the voltage drop caused by a write current or a read current.

The contact $VW_{51}$ is formed to electrically connect to a portion (for example a central portion) of the word line $WL_{51}$, and also to the driving circuit $100_{51}$ through the space between the word line $WL_{31}$ and the word line $WL_{32}$ and the space between the word line $WL_{11}$ and the word line $WL_{12}$. The contact $VW_{52}$ is formed to electrically connect to a portion (for example a central portion) of the word line $WL_{52}$, and also to the driving circuit $100_{52}$ through the space on the right side of the word lines $WL_{42}$ and $WL_{32}$ and the space on the right side of the word lines $WL_{22}$ and $WL_{12}$. The control circuit 200 also controls bit lines connected to PCM elements to be accessed.

Each driving circuit includes a p-channel transistor and an n-channel transistor connected in series. The gate of each of the series-connected p-channel transistor and n-channel transistor is connected to the control circuit 200. An intermediate node (connection node) of the series-connected transistors is electrically connected to the corresponding word line through the corresponding contact. Each of the driving circuits supplies a write current or a read current via the corresponding word line to the PCM element to be accessed.

Furthermore, in the semiconductor memory device according to the first embodiment, the bit line $BL_{14}$ is electrically connected to the bit line $BL_{44}$ through a contact $VB_{44}$, and to the control circuit 200 through a contact $VB_{14}$, as shown in FIG. 2. The bit line $BL_{34}$ is electrically connected to the bit line $BL_{64}$ through a contact $VB_{64}$, and the bit line $BL_{24}$ is electrically connected to the control circuit 200 through a contact $VB_{24}$.

The semiconductor memory device according to the first embodiment also includes stacked bit lines $BL_{24}'$ and $BL_{34}'$ located at a distance from the right end of the stacked bit lines $BL_{24}$ and $BL_{34}$ and extending in the x direction. The contact $VB_{44}$ is disposed to pass through the space between the bit lines $BL_{24}$, $BL_{34}$ and the bit lines $BL_{24}'$, $BL_{34}'$. Furthermore, a bit line $BL_{64}'$ extending in the x direction is disposed at a distance from the right end of the bit line $BL_{64}$. The bit line $BL_{64}'$ is electrically connected to the bit line $BL_{34}'$ through the contact $VB_{64}'$. The contact $VB_{64}'$ passes through the space on the right side of the bit lines $BL_{44}$, $BL_{54}$ and is electrically connected to the bit line $BL_{34}'$. The contact $VB_{64}$ passes through the space on the left side of the bit lines $BL_{44}$, $BL_{54}$ and electrically connected to the bit line $BL_{34}$. The contact $VB_{24}$ passes through the space on the left side of the bit line $BL_{14}$ and is electrically connected to the control circuit 200. The contact $VB_{24}'$ passes through the space on the right side of the bit line $BL_{14}$ and is electrically connected to the control circuit 200. The bit lines $BL_{44}$, $BL_{54}$ are located directly above the bit line $BL_{14}$, the bit line $BL_{64}$ is located directly above the bit lines $BL_{24}$, $BL_{34}$, and the bit line $BL_{64}'$ is located directly above the bit lines $BL_{24}'$, $BL_{34}'$. Therefore, the location of the bit line $BL_{14}$ is shifted along the x direction from the locations of the bit lines $BL_{24}$, $BL_{34}$, and $BL_{64}$, and also the locations of the bit lines $BL_{24}'$, $BL_{34}'$, and $BL_{64}'$. The location of the bit line $BL_{64}$ is shifted along the x direction from the location of the bit lines $BL_{44}$, $BL_{54}$, and the location of the bit line $BL_{64}'$ is shifted along the x direction from the location of the bit lines $BL_{44}$, $BL_{54}$.

As described above, in the first embodiment and second and third embodiments that will be described later, a bit line (for example, the bit line $BL_{14}$) of the first semiconductor memory $10_1$ on the bottom and a bit line (for example, the bit line $BL_{44}$) of the fourth semiconductor memory $10_4$, the location of which along the x direction is the same as the location of the bit line of the first semiconductor memory $10_1$, are connected to each other through the contact $VB_{44}$, and a bit line (for example, the bit line $BL_{34}$) of the third semiconductor memory $10_3$ and a bit line (for example, the bit line $BL_{64}$) of the sixth semiconductor memory $10_6$, the location of which along the x direction is the same as the location of the bit line of the third semiconductor memory $10_3$, are connected to each other through the contact $VB_{64}$. In other words, a bit line of the $i^{th}$ (i=1, 2, 3, 4) semiconductor memory and a bit line of the $(i+3)^{th}$ semiconductor memory, the location of which along the x direction is the same as the bit line of the $i^{th}$ semiconductor memory, are electrically connected to each other through a contact.

Furthermore, in the semiconductor memory device according to the first embodiment, a plurality of (three in FIG. 2) sets of stacked word lines $WL_{11}$, $WL_{21}$ are disposed between the left region relative to the contact $VB_{44}$ of the bit line $BL_{14}$ and the right region relative to the contact $VB_{24}$ of the bit line $BL_{24}$. The PCM element $11_{14}$ is disposed between the bit line $BL_{14}$ and each word line $WL_{11}$, and the PCM element $11_{24}$ is disposed between the bit line $BL_{24}$ and each word line $WL_{21}$.

A plurality of (three in FIG. 2) sets of stacked word lines $WL_{11}'$, $WL_{21}'$ are disposed between the right region relative to the contact $VB_{44}$ of the bit line $BL_{14}$ and the left region relative to the contact $VB_{24}'$ of the bit line $BL_{24}'$. The PCM element $11_{14}'$ is disposed between the bit line $BL_{14}$ and each word line and the PCM element $11_{24}'$ is disposed between the bit line $BL_{24}'$ and each word line $WL_{21}'$.

A plurality of (three in FIG. 2) sets of stacked word lines $WL_{31}$, $WL_{41}$ are disposed between the left region relative to the contact $VB_{44}$ of the bit line $BL_{44}$ and the right region relative to the contact $VB_{64}$ of the bit line $BL_{34}$. The PCM element $11_{34}$ is disposed between the bit line $BL_{34}$ and each word line $WL_{31}$, and the PCM element $11_{44}$ is disposed between the bit line $BL_{44}$ and each word line $WL_{41}$.

A plurality of (three in FIG. 2) sets of stacked word lines $WL_{31}'$, $WL_{41}'$ are disposed between the right region relative to the contact $VB_{44}$ of the bit line $BL_{44}$ and the left region relative to the contact $VB_{64}'$ of the bit line $BL_{34}'$. The PCM element $11_{34}'$ is disposed between the bit line $BL_{34}'$ and each word line $WL_{31}'$ and the PCM element $11_{44}'$ is disposed between the bit line $BL_{44}$ and each word line $WL_{41}'$.

A plurality of (three in FIG. 2) sets of word lines $WL_{51}$, $WL_{61}$ are disposed between the right region relative to the contact $VB_{64}$ of the bit line $BL_{64}$ and the left region of the bit line $BL_{54}$. The PCM element $11_{54}$ is disposed between the bit line $BL_{54}$ and each word line $WL_{51}$, and the PCM element $11_{64}$ is disposed between the bit line $BL_{64}$ and each word line $WL_{61}$.

A plurality of (three in FIG. 2) sets of stacked word lines $WL_{51}'$, $WL_{61}'$ are disposed between the left region relative to the contact $VB_{64}'$ of the bit line $BL_{64}'$ and the right region of the bit line $BL_{54}$. The PCM element $11_{54}'$ is disposed between the bit line $BL_{54}$ and each word line $WL_{51}'$, and the PCM element $11_{64}'$ is disposed between the bit line $BL_{64}'$ and each word line $WL_{61}'$.

A plurality of sets of word lines and PCM elements connected to those word line sets, which are not shown, are disposed on the left region relative to the contact $VB_{24}$ of the bit line $BL_{24}$. A plurality of sets of word lines and PCM elements connected to those word line sets, which are not shown, are disposed on the left region relative to the contact $VB_{64}$ of the bit line $BL_{34}$. A plurality of sets of word lines and PCM elements connected to those word line sets, which are not shown, are disposed on the right region relative to the contact $VB_{24}'$ of the bit line $BL_{24}'$. A plurality of sets of word lines and PCM elements connected to those word line sets, which are not shown, are disposed on the right region relative to the contact $VB_{64}'$ of the bit line $BL_{34}'$. A plurality of sets of word lines and PCM elements connected to those word line sets, which are not shown, are disposed on the left region relative to the contact $VB_{64}$ of the bit line $BL_{64}$. A plurality of sets of word lines and PCM elements connected to those word line sets, which are not shown, are disposed on the right region relative to the contact $VB_{64}'$ of the bit line $BL_{64}'$.

In the first embodiment having the above-described structure and the second and third embodiments that will be described later, the PCM elements includes a phase-change material, the phase of which changes between crystal phase and amorphous phase. An example of the phase-change material is a chalcogenide alloy (for example, a GeSbTe alloy). The chalcogenide alloy contains a chalcogenide (GeSbTe). Other examples include a AsSbTe alloy, a TaSbTe alloy, a NbSbTe alloy, a VSbTe alloy, a NbSbSe alloy, a VSbSe alloy, a WSbTe alloy, a MoSbTe alloy, a CrSbTe alloy, a WSbSe alloy, a MoSbSe alloy, a CrSbSe alloy, and a SnSbTe alloy.

A phase-change material changes to the crystal phase having a low resistance value if it is heated, melted, and cooled slowly, and to the amorphous phase having a high resistance value if it is cooled rapidly. Therefore, if a PCM element is heated by applying a voltage between the corresponding word line and the corresponding bit line, and then the voltage is rapidly dropped, the phase-change material of the PCM element is cooled rapidly and changes to the amorphous phase that is in a high-resistance state. If the voltage is dropped slowly, the phase-change material of the PCM element is cooled slowly and changes to the crystal phase that is in a low-resistance state. Data (information) may be written to the PCM element in this manner. The data (information) may be read from the PCM element by applying a voltage between the corresponding word line and the corresponding bit line, and measuring a current caused to flow by the voltage application, thereby measuring the resistance of the PCM element, for example.

As described above, according to the first embodiment, the contact $VW_{51}$ is electrically connected to a driving circuit for the fifth semiconductor memory $10_5$, for example the driving circuit $100_{51}$, and the contact $VW_{32}$ is electrically connected to a driving circuit for the third semiconductor memory $10_3$, for example the driving circuit $100_{32}$, through the space between the word line $WL_{31}$ and the word line $WL_{32}$ of the third semiconductor memory $10_3$, the space between the word line $WL_{21}$ and the word line $WL_{22}$ of the second semiconductor memory $10_2$, and the space between the word line WL11 and the word line $WL_{12}$ of the first semiconductor memory $10_1$.

Thus, a contact electrically connected to a word line (for example, the word line $WL_{61}$) included in the uppermost semiconductor memory $10_6$ passes through the spaces between the word lines included in the semiconductor memories $10_4$, $10_3$, and $10_2$ that are located at two or more levels below the uppermost semiconductor memory $10_6$, and is electrically connected to the corresponding driving circuit. A contact electrically connected to one of the word lines included in any of the semiconductor memories $10_3$, $10_4$, $10_5$, and $10_6$ located at the third or higher level passes through the space between the word lines included in the semiconductor memory $10_1$ disposed at the first level, or the space on the right or left side of either of the word lines included in the semiconductor memory $10_1$ that is located substantially the same position as the word line electrically connected to the contact, and is electrically connected to the corresponding driving circuit. For example, the contact electrically connected to the word line $WL_{31}$ passes through the space at the left end of the word line $WL_{11}$ of the semiconductor memory $10_1$ and electrically connected to the corresponding driving circuit.

As a result, a contact for the fifth semiconductor memory $10_5$, for example the contact $VW_{51}$ electrically connecting a word line, for example the word line $WL_{51}$, and the driving circuit $100_{51}$ that is located on the bottom does not contact the word lines of the first to fourth semiconductor memories $10_1$ to $10_4$. Therefore, it is not necessary to divide the word lines of the semiconductor memories located below the fifth semiconductor memory $10_5$. As a result, an increase in chip size may be prevented.

Second Embodiment

Figure 3:
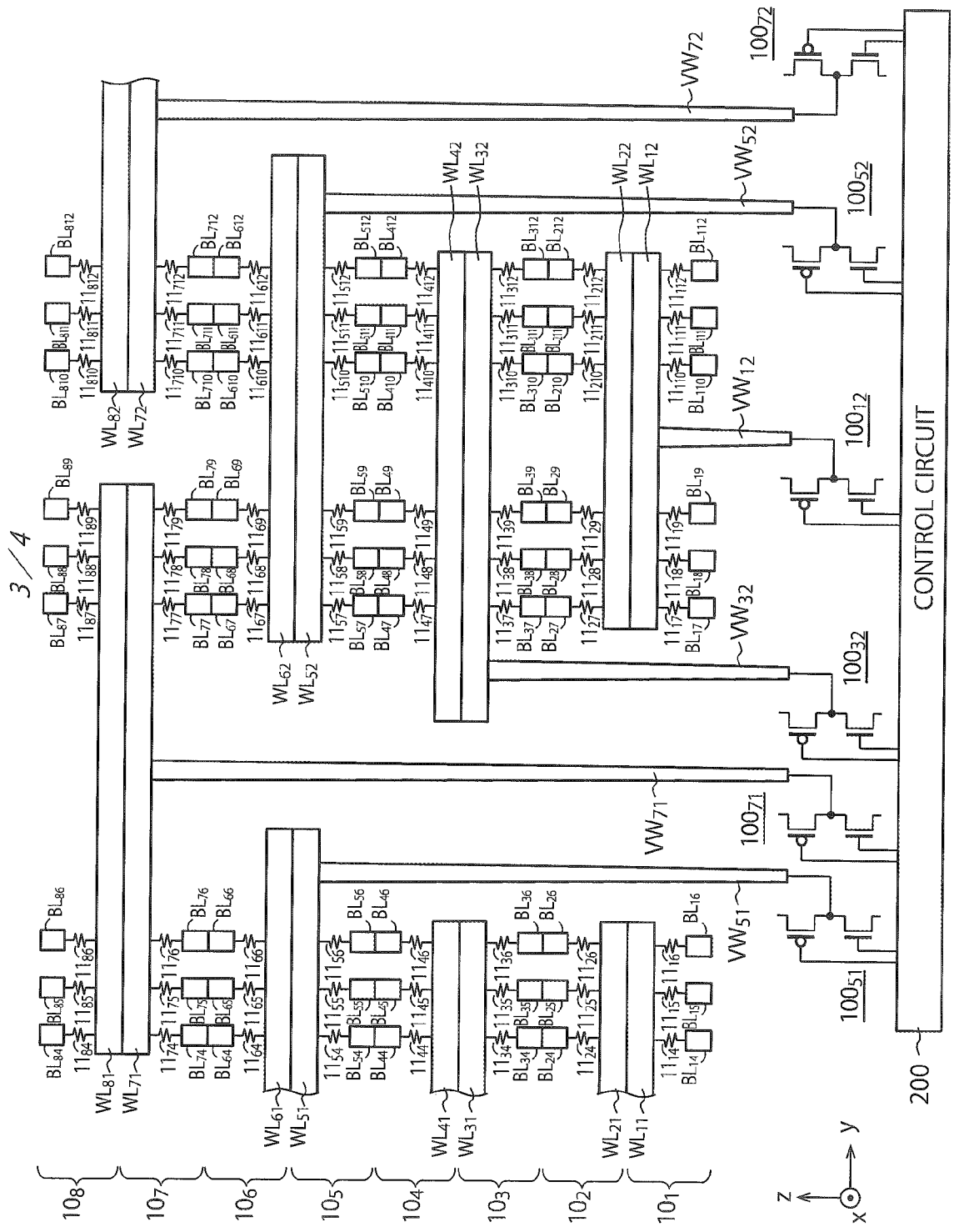
FIG. 3 is a cross-sectional view of a semiconductor memory device according to a second embodiment.

FIG. 3 shows a semiconductor memory device according to a second embodiment. Like the semiconductor memory device according to the first embodiment, the semiconductor memory device according to the second embodiment has a structure in which a contact electrically connecting to a word line included in the uppermost semiconductor memory passes through the space between word lines included in semiconductor memories located two or more levels below the uppermost semiconductor memory to be electrically connected to a corresponding driving circuit. Furthermore, a contact electrically connecting to a word line of each of the semiconductor memories disposed at the third or higher levels passes through the space between the word lines of the semiconductor memory disposed at the first level, or the space on the right or left side of any of the word lines included in the semiconductor memory that is located at substantially the same position as the word line to which the contact is electrically connected, to be electrically connected to a corresponding driving circuit. The structure of the semiconductor memory device according to the second embodiment will be described below with reference to FIG. 3.

The semiconductor memory device according to the second embodiment has a structure obtained by sequentially stacking a cross-point semiconductor memory $10_1$, a cross-point semiconductor memory $10_2$, a cross-point semiconductor memory $10_3$, a cross-point semiconductor memory $10_4$, a cross-point semiconductor memory $10_5$, a cross-point semiconductor memory $10_6$, a cross-point semiconductor memory $10_7$, and a cross-point semiconductor memory $10_8$. In the following descriptions, each memory cell of the respective semiconductor memories has a resistive change element serving as a storage element. The resistive change element is a PCM element in the following descriptions, but not limited thereto.

The semiconductor memory $10_1$ includes a plurality of (nine in FIG. 3) bit lines $BL_{14}$ to $BL_{112}$, a plurality of (nine in FIG. 3) PCM elements $11_{14}$ to $11_{112}$, and a plurality of (two in FIG. 3) word lines $WL_{11}$ and $WL_{12}$. The bit lines $BL_{14}$ to $BL_{112}$, the PCM elements $11_{14}$ to $11_{112}$, and the word lines $WL_{11}$ and $WL_{12}$ are disposed at different levels in a z direction (the vertical direction in FIG. 3).

The bit lines $BL_{14}$ to $BL_{112}$ extend in a direction perpendicular to the plane of FIG. 3 (x direction). The word line $WL_{11}$ and the word line $WL_{12}$ extend in a lateral direction in FIG. 3 (y direction), and separated from each other. In other words, there is a space between the word line $WL_{11}$ and the word line $WL_{12}$. One end of the PCM element $11_{1j}$ is electrically connected to the bit line $BL_{1j}$ (j=4, . . . , 12). The other end of each of the PCM elements $11_{14}$ to $11_{16}$ is electrically connected to the word line $WL_{11}$. The other end of each of the PCM elements $11_{17}$ to $11_{112}$ is electrically connected to the word line $WL_{12}$.

The semiconductor memory $10_2$ includes a plurality of (two in FIG. 3) word lines $WL_{21}$ and $WL_{22}$, a plurality of (nine in FIG. 3) bit lines $BL_{24}$ to $BL_{212}$, and a plurality of (nine in FIG. 3) PCM elements $11_{24}$ to $11_{212}$. The word lines $WL_{21}$ and $WL_{22}$, the PCM elements $11_{24}$ to $11_{212}$, and the bit lines $BL_{24}$ to $BL_{212}$ are disposed at different levels in the z direction (the vertical direction in FIG. 3).

The word line $WL_{21}$ and the word line $WL_{22}$ extend in the lateral direction in FIG. 3 (y direction), and separated from each other. The word line $WL_{21}$ and the word line $WL_{22}$ are disposed to be in electrical contact with the top faces of the word line $WL_{11}$ and the word line $WL_{12}$ of the semiconductor memory $10_1$, respectively. The lengths of the word line $WL_{21}$ and the word line $WL_{22}$ in the y direction are substantially the same as the lengths of the word line $WL_{11}$ and the word line $WL_{12}$ in the y direction, respectively. Thus, like the word line $WL_{11}$ and the word line $WL_{12}$, there is a space between the word line $WL_{21}$ and the word line $WL_{22}$. The bit lines $BL_{24}$ to $BL_{212}$ extend in the direction perpendicular to the plane of FIG. 3 (x direction). One end of each of the PCM elements $11_{24}$ to $11_{26}$ is electrically connected to the word line $WL_{21}$. One end of each of the PCM elements $11_{27}$ to $11_{212}$ is electrically connected to the word line $WL_{22}$. The other end of the PCM element $11_{2j}$ (j=4, . . . , 12) is electrically connected to the bit line $BL_{2j}$.

The semiconductor memory $10_3$ includes a plurality of (nine in FIG. 3) bit lines $BL_{34}$ to $BL_{312}$, a plurality of (nine in FIG. 3) PCM elements $11_{34}$ to $11_{312}$, and a plurality of (two in FIG. 3) word lines $WL_{31}$ and $WL_{32}$. The bit lines $BL_{34}$ to $BL_{312}$, the PCM elements $11_{34}$ to $11_{312}$, and the word lines $WL_{31}$ and $WL_{32}$ are disposed at different levels in the z direction (the vertical direction in FIG. 3).

The bit lines $BL_{34}$ to $BL_{312}$ extend in the direction perpendicular to the plane of FIG. 3 (x direction). The bit line $BL_{3j}$ (j=4, . . . , 12) is arranged to be in electrical contact with the top face of the bit line $BL_{2j}$ of the semiconductor memory $10_2$. The word line $WL_{31}$ and the word line $WL_{32}$ extend in the lateral direction in FIG. 3 (y direction), and separated from each other. In other words, there is a space between the word line $WL_{31}$ and the word line $WL_{32}$. The word line $WL_{31}$ is arranged at substantially the same location as the word line $WL_{11}$ and the word line $WL_{21}$ in the y direction. However, the length of the word line $WL_{31}$ in the y direction is longer than the length of each of the word line $WL_{11}$ and the word line $WL_{21}$ in the y direction to have a region where a contact (not shown) is disposed. The word line $WL_{32}$ is arranged at substantially the same location as the word line $WL_{12}$ and the word line $WL_{22}$ in the y direction. However, the length of the word line $WL_{32}$ in the y direction is longer than the length of each of the word line $WL_{12}$ and the word line $WL_{22}$ in the y direction to have a region where a contact $VW_{32}$ is disposed. For example, in FIG. 3, the contact $VW_{32}$ is disposed on a left and (on the word line $WL_{31}$ side) of the word line $WL_{32}$. Therefore, the length in the y direction of the space between the word line $WL_{31}$ and the word line $WL_{32}$ is shorter than the length in the y direction of the space between the word line $WL_{11}$ and the word line $WL_{12}$. One end of the PCM element $11_{3j}$ is electrically connected to the bit line $BL_{3j}$ (j=4, . . . , 12). The other end of each of the PCM elements $11_{34}$ to $11_{36}$ is electrically connected to the word line $WL_{31}$. The other end of each of the PCM elements $11_{37}$ to $11_{312}$ is electrically connected to the word line $WL_{32}$.

The semiconductor memory $10_4$ includes a plurality of (two in FIG. 3) word lines $WL_{41}$ and $WL_{42}$, a plurality of (nine in FIG. 1) bit lines $BL_{44}$ to $BL_{412}$, and a plurality of (nine in FIG. 3) PCM elements $11_{44}$ to $11_{412}$. The word lines $WL_{41}$ and $WL_{42}$, the PCM elements $11_{44}$ to $11_{412}$, and the bit lines $BL_{44}$ to $BL_{412}$ are disposed at different levels in the z direction (the vertical direction in FIG. 3).

The word line $WL_{41}$ and the word line $WL_{42}$ extend in the lateral direction in FIG. 3 (y direction), and separated from each other. The word line $WL_{41}$ and the word line $WL_{42}$ are disposed to be in electrical contact with the top faces of the word line $WL_{31}$ and the word line $WL_{32}$ of the semiconductor memory $10_3$, respectively. The lengths of the word line $WL_{41}$ and the word line $WL_{42}$ in the y direction are substantially the same as the lengths of the word line $WL_{31}$ and the word line $WL_{32}$ in the y direction, respectively. Thus, like the word line $WL_{31}$ and the word line $WL_{32}$, there is a space between the word line $WL_{41}$ and the word line $WL_{42}$. The bit lines $BL_{44}$ to $BL_{412}$ extend in the direction perpendicular to the plane of FIG. 3 (x direction). One end of each of the PCM elements $11_{44}$ to $11_{46}$ is electrically connected to the word line $WL_{41}$. One end of each of the PCM elements $11_{47}$ to $11_{412}$ is electrically connected to the word line $WL_{42}$. The other end of the PCM element $11_{4j}$ (j=4, . . . , 12) is electrically connected to the bit line $BL_{4j}$.

The semiconductor memory $10_5$ includes a plurality of (nine in FIG. 3) bit lines $BL_{54}$ to $BL_{512}$, a plurality of (nine in FIG. 1) PCM elements $11_{54}$ to $11_{512}$, and a plurality of (two in FIG. 3) word lines $WL_{51}$ and $WL_{52}$. The bit lines $BL_{54}$ to $BL_{512}$, the PCM elements $11_{54}$ to $11_{512}$, and the word lines $WL_{51}$ and $WL_{52}$ are disposed at different levels in the z direction (the vertical direction in FIG. 3).

The bit lines $BL_{54}$ to $BL_{512}$ extend in the direction perpendicular to the plane of FIG. 3 (x direction). The bit line $BL_{5j}$ (j=4, . . . , 12) is arranged to be in electrical contact with the top face of the bit line $BL_{4j}$ of the semiconductor memory $10_4$. The word line $WL_{51}$ and the word line $WL_{52}$ extend in the lateral direction in FIG. 3 (y direction), and separated from each other. In other words, there is a space between the word line $WL_{51}$ and the word line $WL_{52}$. The word line $WL_{51}$ is arranged at substantially the same location as the word line $WL_{11}$ and the word line $WL_{21}$ in the y direction. However, the length of the word line $WL_{51}$ in the y direction is longer than the length of each of the word line $WL_{11}$ and the word line $WL_{21}$ in the y direction to have a region where a contact $VW_{51}$ is disposed. The contact $VW_{51}$ is electrically connected to the word line $WL_{51}$ and also to the driving circuit $100_{51}$. The word line $WL_{52}$ is arranged at substantially the same location as the word line $WL_{12}$ and the word line $WL_{22}$ in the y direction. However, the length of the word line $WL_{52}$ in the y direction is longer than the length of each of the word line $WL_{12}$ and the word line $WL_{22}$ in the y direction to have a region where a contact (not shown) is disposed. For example, in FIG. 3, the contact $VW_{51}$ connecting to the word line $WL_{51}$ is disposed at an end on the word line $WL_{52}$ side. Therefore, the length in the y direction of the space between the word line $WL_{51}$ and the word line $WL_{52}$ is shorter than the length in the y direction of the space between the word line $WL_{11}$ and the word line $WL_{12}$. In FIG. 3, the contact $VW_{52}$ connecting to the word line $WL_{52}$ is disposed at a right end of the word line $WL_{52}$.

One end of the PCM element $11_{51}$ is electrically connected to the bit line $BL_{5j}$ (j=4, ..., 12). The other end of each of the PCM elements $11_{54}$ to $11_{56}$ is electrically connected to the word line $WL_{51}$. The other end of each of the PCM elements $11_{57}$ to $11_{512}$ is electrically connected to the word line $WL_{52}$.

The semiconductor memory $10_6$ includes a plurality of (two in FIG. 3) word lines $WL_{61}$ and $WL_{62}$, a plurality of (nine in FIG. 1) bit lines $BL_{64}$ to $BL_{612}$, and a plurality of (nine in FIG. 1) PCM elements $11_{64}$ to $11_{612}$. The word lines $WL_{61}$ and $WL_{62}$, the PCM elements $11_{64}$ to $11_{612}$, and the bit lines $BL_{64}$ to $BL_{612}$ are disposed at different levels in the z direction (the vertical direction in FIG. 3).

The word line $WL_{61}$ and the word line $WL_{62}$ extend in the lateral direction in FIG. 3 (y direction), and separated from each other. The word line $WL_{61}$ and the word line $WL_{62}$ are disposed to be in electrical contact with the top faces of the word line $WL_{51}$ and the word line $WL_{52}$ of the semiconductor memory $10_5$, respectively. The lengths of the word line $WL_{61}$ and the word line $WL_{62}$ in the y direction are substantially the same as the lengths of the word line $WL_{51}$ and the word line $WL_{52}$ in the y direction, respectively. Thus, like the word line $WL_{51}$ and the word line $WL_{52}$, there is a space between the word line $WL_{61}$ and the word line $WL_{62}$. The bit lines $BL_{64}$ to $BL_{612}$ extend in the direction perpendicular to the plane of FIG. 3 (x direction). One end of each of the PCM elements $11_{64}$ to $11_{66}$ is electrically connected to the word line $WL_{61}$. One end of each of the PCM elements $11_{67}$ to $11_{612}$ is electrically connected to the word line $WL_{62}$. The other end of the PCM element $11_{6j}$ (j=4, ..., 12) is electrically connected to the bit line $BL_{6j}$.

The semiconductor memory $10_7$ includes a plurality of (nine in FIG. 3) bit lines $BL_{74}$ to $BL_{712}$, a plurality of (nine in FIG. 1) PCM elements $11_{74}$ to $11_{712}$, a plurality of (two in FIG. 3) word lines $WL_{71}$ and $WL_{72}$. The bit lines $BL_{74}$ to $BL_{712}$, the PCM elements $11_{74}$ to $11_{712}$, and the word lines $WL_{71}$ and $WL_{72}$ are disposed at different levels in the z direction (the vertical direction in FIG. 3).

The bit lines $BL_{74}$ to $BL_{712}$ extend in the direction perpendicular to the plane of FIG. 3 (x direction). The bit line $BL_{7j}$ (j=4, ..., 12) is arranged to be in electrical contact with the top face of the bit line $BL_{6j}$ of the semiconductor memory $10_6$. The word line $WL_{71}$ and the word line $WL_{72}$ extend in the lateral direction in FIG. 3 (y direction), and separated from each other. In other words, there is a space between the word line $WL_{71}$ and the word line $WL_{72}$. The word line $WL_{71}$ is arranged at a location that is different from the locations of the word line $WL_{51}$ and the word line $WL_{61}$ in the y direction. The word line $WL_{72}$ is arranged at a location that is different from the locations of the word line $WL_{52}$ and the word line $WL_{62}$ in the y direction. For example, in FIG. 3, the central portion in the y direction of the word line $WL_{71}$ is located above the central portion of the space between the word line $WL_{11}$ and the word line $WL_{12}$ (in the z direction). One end of the PCM element $11_{7j}$ is electrically connected to the bit line $BL_{7j}$ (j=4, ..., 12). The other end of each of the PCM elements $11_{74}$ to $11_{76}$ is electrically connected to the word line $WL_{71}$. The other end of each of the PCM elements $11_{77}$ to $11_{712}$ is electrically connected to the word line $WL_{72}$.

The semiconductor memory $10_8$ includes a plurality of (two in FIG. 3) word lines $WL_{81}$ and $WL_{82}$, a plurality of (nine in FIG. 3) bit lines $BL_{84}$ to $BL_{812}$, and a plurality of (nine in FIG. 3) PCM elements $11_{84}$ to $11_{812}$. The word lines $WL_{81}$ and $WL_{82}$, the PCM elements $11_{84}$ to $11_{812}$, and the bit lines $BL_{84}$ to $BL_{812}$ disposed at different levels in the z direction (the vertical direction in FIG. 3).

The word line $WL_{81}$ and the word line $WL_{82}$ extend in a lateral direction in FIG. 3 (y direction), and separated from each other. The word line $WL_{81}$ and the word line $WL_{82}$ are disposed to be in electrical contact with the top faces of the word line $WL_{71}$ and the word line $WL_{72}$ of the semiconductor memory $10_7$, respectively. The lengths of the word line $WL_{81}$ and the word line $WL_{82}$ in the y direction are substantially the same as the lengths of the word line $WL_{71}$ and the word line $WL_{72}$ in the y direction, respectively. Thus, like the word line $WL_{71}$ and the word line $WL_{72}$, there is a space between the word line $WL_{81}$ and the word line $WL_{82}$. The bit lines $BL_{84}$ to $BL_{812}$ extend in the direction perpendicular to the plane of FIG. 3 (x direction). One end of each of the PCM elements $11_{84}$ to $11_{86}$ is electrically connected to the word line $WL_{81}$. One end of each of the PCM elements $11_{87}$ to $11_{812}$ is electrically connected to the word line $WL_{82}$. The other end of the PCM element $11_{8j}$ (j=4, ..., 12) is electrically connected to the bit line $BL_{8j}$.

One end of each of three PCM elements that are not shown is electrically connected to each of the word line $WL_{21}$, $WL_{31}$, $WL_{41}$, $WL_{51}$, and $WL_{61}$, and the other ends of the PCM elements are electrically connected to bit lines that are not shown. One end of each of three PCM elements that are not shown is electrically connected to each of the word lines $WL_{72}$ and $WL_{82}$, and the other ends of the PCM elements are electrically connected to bit lines that are not shown. Thus, in the semiconductor memory device shown in FIG. 3, one end of each of six PCM elements is electrically connected to each word line. The number of PCM elements electrically connected to each word line may be more than six.

The semiconductor memory device shown in FIG. 3 also includes driving circuits (for example, driving circuits $100_{12}$, $100_{32}$, $100_{51}$, $100_{52}$, $100_{71}$, and $100_{72}$) for driving the respective word lines, and a control circuit 200 for controlling the driving circuits. For example, the driving circuit $100_{12}$ is connected to the word line $WL_{12}$ through a contact $VW_{12}$, the driving circuit $100_{32}$ is connected to the word line $WL_{32}$ through a contact $VW_{32}$, the driving circuit $100_{51}$ is connected to the word line $WL_{51}$ through a contact $VW_{51}$, and the driving circuit $100_{52}$ is connected to the word line $WL_{52}$ through a contact $VW_{52}$. Since the word line $WL_{22}$ is arranged to be in contact with the top face of the word line $WL_{12}$, it is driven by the driving circuit $100_{12}$. Since the word line $WL_{42}$ is arranged to be in contact with the top face of the word line $WL_{32}$, it is driven by the driving circuit $100_{32}$. Since the word line $WL_{61}$ is arranged to be in contact with the top face of the word line $WL_{51}$, it is driven by the driving circuit $100_{51}$. Since the word line $WL_{62}$ is arranged to be in contact with the top face of the word line $WL_{52}$, it is driven by the driving circuit $100_{52}$. Since the word line $WL_{31}$ is arranged to be in contact with the top face of the word line $WL_{71}$, it is driven by the driving circuit $100_{71}$.

Since the word line $WL_{32}$ is arranged to be in contact with the top face of the word line $WL_{72}$, it is driven by the driving circuit $100_{72}$.

The word lines $WL_{11}$ and $WL_{31}$ are driven by driving circuits, which are not shown, through contacts, which are not shown, either. As in the case of the contact of the word line $WL_{12}$, the contact for the word line $WL_{11}$ is formed to electrically connect to a portion (for example a central portion) of the word line $WL_{11}$. As in the case of the contact of the word line $WL_{32}$, the contact for the word line $WL_{31}$ is formed to electrically connect to a portion (for example a left end) of the word line $WL_{31}$. Since the word lines $WL_{21}$ and $WL_{41}$ are in contact with the top faces of the word lines $WL_{11}$ and $WL_{31}$, respectively, they are driven by the aforementioned driving circuits that are not shown.

The contact $VW_{12}$ is formed to electrically connect to a portion (for example a central portion) of the word line $WL_{12}$. The contact $VW_{32}$ is formed to electrically connect to an end of the word line $WL_{32}$ on the word line $WL_{31}$ side, and also to the driving circuit $100_{32}$ via a space between the word line $WL_{11}$ and the word line $WL_{12}$. The bit line $BL_{3j}$ for the PCM element $11_{3j}$ (j=7 . . . , 12) connecting to the word line $WL_{32}$ is stacked on the bit line $BL_{2j}$. As a result, the wiring resistance of this portion is lower than that of a single wiring. Therefore, the existence of the contact $VW_{32}$ at the end of the word line $WL_{32}$ does not affect the voltage drop caused by a write current or a read current.

The contact $VW_{51}$ is formed to electrically connect to an end (right end) of the word line $WL_{51}$ on the word line $WL_{52}$ side and also to the driving circuit $100_{51}$ through the space between the word line $WL_{31}$ and the word line $WL_{32}$ and the space between the word line $WL_{11}$ and the word line $WL_{12}$. The contact $VW_{52}$ is formed to electrically connect to a right end of the word line $WL_{52}$ and also to the driving circuit $100_{52}$ through the space on the right side of the word lines $WL_{42}$ and $WL_{32}$ and the space on the right side of the word lines $WL_{22}$ and $WL_{12}$. The contact $VW_{71}$ is formed to electrically connect to a portion (for example a central portion) of the word line $WL_{71}$, and also to the driving circuit $100_{71}$ through the space between the word line $WL_{51}$ and the word line $WL_{52}$, the space between the word line $WL_{31}$ and the word line $WL_{32}$, and the space between the word line $WL_{11}$ and the word line $WL_{12}$. The contact $VW_{72}$ is formed to electrically connect to a portion (for example a central portion) of the word line $WL_{71}$ and also to the driving circuit $100_{72}$ through the space on the right side of the word line $WL_{52}$, the space on the right side of the word line $WL_{32}$, and the space on the right side of the word line $WL_{12}$. The control circuit 200 also controls bit lines connected to PCM elements to be accessed.

As in the first embodiment, each driving circuit includes a p-channel transistor and an n-channel transistor connected in series. The gate of each of the series-connected p-channel transistor and n-channel transistor is connected to the control circuit 200. An intermediate node (connection node) of the series-connected transistors is electrically connected to a central portion of the corresponding word line. Each of the driving circuits supplies a write current or a read current via the corresponding word line to the PCM element to be accessed. Each of the PCM elements has the same structure as that of the first embodiment.

As described above, the semiconductor memory device according to the second embodiment has a structure in which the contact $VW_{71}$ electrically connected to the word line included in the uppermost semiconductor memory $10_8$ is also electrically connected to the corresponding driving circuit $100_{71}$ through the space between adjacent word lines of each of the semiconductor memories $10_6$, $10_5$, $10_4$, $10_3$, $10_2$, and $10_1$, which are arranged two or more levels below the uppermost semiconductor memory. Each of the contacts electrically connected to one of the word lines included in any of the semiconductor memories $10_6$, $10_5$, $10_4$, and $10_3$ arranged at the third or higher level is electrically connected to the corresponding driving circuit through the space between the word lines included in the semiconductor memory $10_1$ disposed at the first level, or the space on the right or left side of the corresponding word line included in the semiconductor memory $10_1$ arranged on the first layer, which is disposed at substantially the same position as the word line to which the contact is electrically connected.

Thus, the contact $VW_{71}$, for example, for connecting one of the word lines included in the eighth semiconductor memory $10_8$, for example the word line $WL_{81}$, and the driving circuit $100_{71}$ located at the lowermost level, does not contact the word lines included in the first to sixth semiconductor memories $10_1$ to $10_6$. Therefore, it is not necessary to divide the word lines of the semiconductor memories located below the eighth semiconductor memory $10_8$. As a result, an increase in chip size may be prevented.

Third Embodiment

Figure 4:
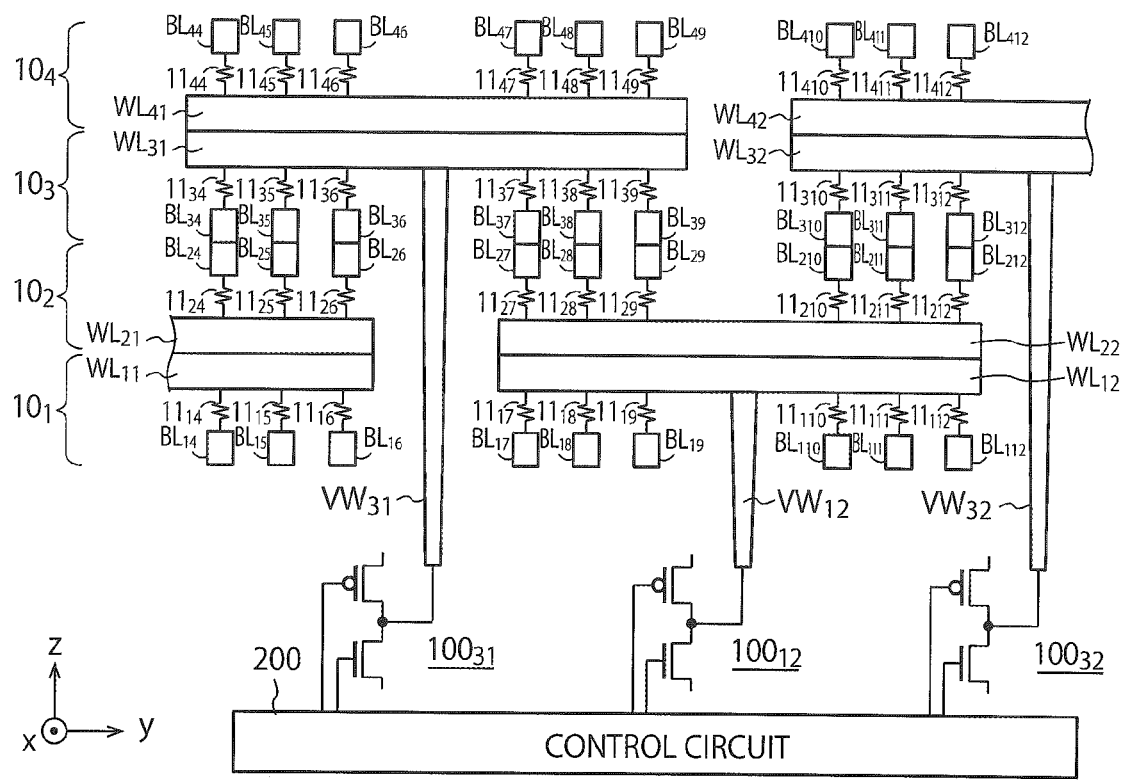
FIG. 4 is a cross-sectional view of a semiconductor memory device according to a third embodiment.

FIG. 4 shows a semiconductor memory device according to a third embodiment. The semiconductor memory device according to the third embodiment has a structure obtained by sequentially stacking a cross-point semiconductor memory $10_1$, a cross-point semiconductor memory $10_2$, a cross-point semiconductor memory $10_3$, and a cross-point semiconductor memory $10_4$. In the following descriptions, each memory cell of the respective semiconductor memories has a resistive change element serving as a storage element. The resistive change element is a PCM element in the following descriptions, but not limited thereto.

The semiconductor memory $10_1$ includes a plurality of (nine in FIG. 4) bit lines $BL_{14}$ to $BL_{112}$, a plurality of (nine in FIG. 4) PCM elements $11_{14}$ to $11_{112}$, a plurality of (two in FIG. 4) word lines $WL_{11}$ and $WL_{12}$. The bit lines $BL_{14}$ to $BL_{112}$, the PCM elements $11_{14}$ to $11_{112}$, and the word lines $WL_{11}$ and $WL_{12}$ are disposed at different levels in a z direction (the vertical direction in FIG. 4).

The bit lines $BL_{14}$ to $BL_{112}$ extend in a direction perpendicular to the plane of FIG. 4 (x direction). The word line $WL_{11}$ and the word line $WL_{12}$ extend in a lateral direction in FIG. 4 (y direction), and separated from each other. In other words, there is a space between the word line $WL_{11}$ and the word line $WL_{12}$. One end of the PCM element $11_{1j}$ is electrically connected to the bit line $BL_{1j}$ (j=4, . . . , 12). The other end of each of the PCM elements $11_{14}$ to $11_{16}$ is electrically connected to the word line $WL_{11}$. The other end of each of the PCM elements $11_{17}$ to $11_{112}$ is electrically connected to the word line $WL_{12}$.

The semiconductor memory $10_2$ includes a plurality of (two in FIG. 4) word lines $WL_{21}$ and $WL_{22}$, a plurality of (nine in FIG. 4) bit lines $BL_{24}$ to $BL_{212}$, and a plurality of (nine in FIG. 4) PCM elements $11_{24}$ to $11_{212}$. The word lines $WL_{21}$ and $WL_{22}$, the PCM elements $11_{24}$ to $11_{212}$, and the bit lines $BL_{24}$ to $BL_{212}$ are disposed at different levels in the z direction (the vertical direction in FIG. 4).

The word line $WL_{21}$ and the word line $WL_{22}$ extend in the lateral direction in FIG. 4 (y direction), and separated from each other. The word line $WL_{21}$ and the word line $WL_{22}$ are disposed to be in electrical contact with the top faces of the word line $WL_{11}$ and the word line $WL_{12}$ of the semiconductor memory $10_1$, respectively. The lengths of the word line $WL_{21}$ and the word line $WL_{22}$ in the y direction are substantially the same as the lengths of the word line $WL_{11}$ and the word line $WL_{12}$ in the y direction, respectively. Thus, like the word line $WL_{11}$ and the word line $WL_{12}$, there is a space between the word line $WL_{21}$ and the word line $WL_{22}$. The bit lines $BL_{24}$ to $BL_{212}$ extend in the direction perpendicular to the plane of FIG. 4 (x direction). One end of each of the PCM elements $11_{24}$ to $11_{26}$ is electrically connected to the word line $WL_{21}$. One end of each of the PCM elements $11_{27}$ to $11_{212}$ is electrically connected to the word line $WL_{22}$. The other end of the PCM element $11_{2j}$ (j=4, ..., 12) is electrically connected to the bit line $BL_{2j}$.

The semiconductor memory $10_3$ includes a plurality of (nine in FIG. 4) bit lines $BL_{34}$ to $BL_{312}$, a plurality of (nine in FIG. 4) PCM elements $11_{34}$ to $11_{312}$, and a plurality of (two in FIG. 4) word lines $WL_{31}$ and $WL_{32}$. The bit lines $BL_{34}$ to $BL_{312}$, the PCM elements $11_{34}$ to $11_{312}$, and the word lines $WL_{31}$ and $WL_{32}$ are disposed at different levels in the z direction (the vertical direction in FIG. 4).

The bit lines $BL_{34}$ to $BL_{312}$ extend in the direction perpendicular to the plane of FIG. 4 (x direction). The bit line $BL_{3j}$ (j=4, ..., 12) is arranged to be in electrical contact with the top face of the bit line $BL_{2j}$ of the semiconductor memory $10_2$. The word line $WL_{31}$ and the word line $WL_{32}$ extend in the lateral direction in FIG. 4 (y direction), and separated from each other. In other words, there is a space between the word line $WL_{31}$ and the word line $WL_{32}$.

The word line $WL_{31}$ is arranged at a different location from the word line $WL_{11}$ and the word line $WL_{21}$ in the y direction, and the word line $WL_{32}$ is arranged at a different location from the word line $WL_{12}$ and the word line $WL_{22}$. For example, in FIG. 4, a central portion in the y direction of the word line $WL_{31}$ is located above (z direction) a central portion of the space between the word line $WL_{11}$ and the word line $WL_{12}$. One end of the PCM element $11_{3j}$ is electrically connected to the bit line $BL_{3j}$ (j=4, ..., 12). The other end of each of the PCM elements $11_{34}$ to $11_{36}$ is electrically connected to the word line $WL_{31}$. The other end of each of the PCM elements $11_{37}$ to $11_{312}$ is electrically connected to the word line $WL_{32}$.

The semiconductor memory $10_4$ includes a plurality of (two in FIG. 4) word lines $WL_{41}$ and $WL_{42}$, a plurality of (nine in FIG. 4) bit lines $BL_{44}$ to $BL_{412}$, and a plurality of (nine in FIG. 4) PCM elements $11_{44}$ to $11_{412}$. The word lines $WL_{41}$ and $WL_{42}$, the PCM elements $11_{44}$ to $11_{412}$, and the bit lines $BL_{44}$ to $BL_{412}$ are disposed at different levels in the z direction (the vertical direction in FIG. 4).

The word line $WL_{41}$ and the word line $WL_{42}$ extend in the lateral direction in FIG. 4 (y direction), and separated from each other. The word line $WL_{41}$ and the word line $WL_{42}$ are disposed to be in electrical contact with the top faces of the word line $WL_{31}$ and the word line $WL_{32}$ of the semiconductor memory $10_3$, respectively. The lengths of the word line $WL_{41}$ and the word line $WL_{42}$ in the y direction are substantially the same as the lengths of the word line $WL_{31}$ and the word line $WL_{32}$ in the y direction, respectively. Thus, like the word line $WL_{31}$ and the word line $WL_{32}$, there is a space between the word line $WL_{41}$ and the word line $WL_{42}$. The bit lines $BL_{44}$ to $BL_{412}$ extend in the direction perpendicular to the plane of FIG. 4 (x direction). One end of each of the PCM elements $11_{44}$ to $11_{46}$ is electrically connected to the word line $WL_{41}$. One end of each of the PCM elements $11_{47}$ to $11_{412}$ is electrically connected to the word line $WL_{42}$. The other end of the PCM element $11_{4j}$ (j=4, ..., 12) is electrically connected to the bit line $BL_{4j}$.

One end of each of three PCM elements that are not shown is electrically connected to each of the word lines $WL_{11}$ and $WL_{21}$, and the other ends of the PCM elements are electrically connected to bit lines that are not shown. One end of each of three PCM elements that are not shown is electrically connected to each of the word lines $WL_{32}$ and $WL_{42}$, and the other ends of the PCM elements are electrically connected to bit lines that are not shown. Thus, in the semiconductor memory device shown in FIG. 4, one end of each of six PCM elements is electrically connected to each word line. The number of PCM elements electrically connected to each word line may be more than six.

The semiconductor memory device according to the third embodiment shown in FIG. 4 also includes driving circuits (for example, driving circuits $100_{12}$, $100_{31}$, $100_{32}$) for driving the respective word lines, and a control circuit 200 for controlling the driving circuits. For example, the driving circuit $100_{12}$ is connected to the word line $WL_{12}$ through a contact $VW_{12}$, the driving circuit $100_{31}$ is connected to the word line $WL_{31}$ through a contact $VW_{31}$, and the driving circuit $100_{32}$ is connected to the word line $WL_{32}$ through a contact $VW_{32}$. Since the word line $WL_{22}$ is arranged to be in contact with the top face of the word line $WL_{12}$, it is driven by the driving circuit $100_{12}$. Since the word line $WL_{41}$ is arranged to be in contact with the top face of the word line $WL_{31}$, it is driven by the driving circuit $100_{31}$. Since the word line $WL_{42}$ is arranged to be in contact with the top face of the word line $WL_{32}$, it is driven by the driving circuit $100_{32}$. The word line $WL_{11}$ is driven by a driving circuit, which is not shown, through a contact that is not shown, either. As in the case of the contact of the word line $WL_{12}$, the contact for the word line $WL_{11}$ is formed to electrically connect to a portion (for example a central portion) of the word line $WL_{11}$. Since the word line $WL_{21}$ is arranged to be in contact with the top face of the word line $WL_{11}$, the word line $WL_{21}$ is driven by the driving circuit that is not shown.

The contact $VW_{12}$ is formed to electrically connect to a portion (for example a central portion) of the word line $WL_{12}$. The contact $VW_{31}$ is formed to electrically connect to a portion (for example a central portion) of the word line $WL_{31}$, and also to the driving circuit $100_{31}$ through the space between the word line $WL_{11}$ and the word line $WL_{12}$. The contact $VW_{32}$ is formed to electrically connect to a portion (for example a central portion) of the word line $WL_{32}$, and also to the driving circuit $100_{32}$ through a space on the right side of the word line $WL_{22}$. The control circuit 200 also controls bit lines connected to PCM elements to be accessed.

Each driving circuit includes a p-channel transistor and an n-channel transistor connected in series. The gate of each of the series-connected p-channel transistor and n-channel transistor is connected to the control circuit 200. An intermediate node (connection node) of the series-connected transistors is electrically connected to a central portion of the corresponding word line. Each of the driving circuits supplies a write current or a read current via the corresponding word line to the PCM element to be accessed.

According to the third embodiment, the contact $VW_{31}$ for example, is electrically connected to the driving circuit for the fourth semiconductor memory $10_4$, for example the driving circuit $100_{31}$, through a space between the word line $WL_{21}$ and the word line $WL_{22}$ of the second semiconductor memory $10_2$, and a space between the word line $WL_{11}$ and the word line $WL_{12}$ of the first semiconductor memory $10_1$. Furthermore, the contact $VW_{32}$ is electrically connected to the driving circuit $100_{32}$ through a space on the right side of the word line $WL_{22}$ of the second semiconductor memory $10_2$ and a space on the right side of the word line $WL_{12}$ of the first semiconductor memory $10_1$.

Thus, the contact $VW_{31}$ electrically connected to the word line included in the uppermost semiconductor memory $10_4$ (for example, the word line $WL_{41}$) is also electrically connected to the corresponding driving circuit $100_{31}$ through the space between adjacent word lines of each of the semiconductor memories $10_2$ and $10_1$ arranged two or more levels below the uppermost semiconductor memory. The contact $VW_{32}$ electrically connected to the word line $WL_{42}$ is electrically connected to the driving circuit $100_{32}$ through a space on the right side of the word line $WL_{22}$ included in the second semiconductor memory $10_2$ and the word line $WL_{12}$ included in the first semiconductor memory $10_1$.

Thus, the contact $VW_{31}$, for example, for connecting one of the word lines included in the fourth semiconductor memory $10_4$, for example the word line $WL_{41}$, and the driving circuit $100_{31}$ located at the lowermost level, does not contact the word lines included in the first and the second semiconductor memories $10_1$ and $10_2$. Therefore, it is not necessary to divide the word lines of the semiconductor memories located below the fourth semiconductor memory $10_4$. As a result, an increase in chip size may be prevented.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a plurality of first wirings disposed at a first level and extending in a first direction;
a second wiring and a third wiring disposed at a second level, a position of which in a second direction intersecting with the first direction is different from that of the first level, the second wiring and the third wiring extending in a third direction that intersects with the first direction and the second direction, and being separated from each other;
a plurality of first resistive change elements each including a first terminal and a second terminal and disposed between one of the first wirings and one of the second wiring and the third wiring, the first terminal being electrically connected to the one of the first wirings, and the second terminal being electrically connected to the one of the second wiring and the third wiring;
a fourth wiring disposed to be in contact with a face of the second wiring opposite to the first wirings and extending in the third direction;
a fifth wiring disposed to be in contact with a face of the third wiring opposite to the first wirings, extending in the third direction, and separated from the fourth wiring;
a plurality of sixth wirings disposed at a third level and extending in the first direction, the second level being between the first level and the third level;
a plurality of second resistive change elements each including a third terminal and a fourth terminal and disposed between one of the fourth wiring and the fifth wiring and one of the sixth wirings, the third terminal being electrically connected to the one of the fourth wiring and the fifth wiring, and the fourth terminal being electrically connected to the one of the sixth wirings;
a plurality of seventh wirings disposed to correspond to the sixth wirings and extending in the first direction, each of the seventh wirings being disposed to be in contact with a face of corresponding one of the sixth wirings opposite to the second resistive change elements;
an eighth wiring and a ninth wiring disposed at a fourth level, extending in the third direction, and separated from each other, the third level being between the fourth level and the second level;
a plurality of third resistive change elements each including a fifth terminal and a six terminal and disposed between one of the seventh wirings and one of the eighth wiring and the ninth wiring, the fifth terminal being electrically connected to the one of the seventh wirings, and the six terminal being electrically connected to the one of the eighth wiring and the ninth wiring;
a tenth wiring disposed to be in contact with a face of the eighth wiring opposite to the seventh wirings and extending in the third direction;
an eleventh wiring disposed to be in contact with a face of the ninth wiring opposite to the seventh wirings and extending in the third direction, and separated from the tenth wiring;
a plurality of twelfth wirings disposed at a fifth level and extending in the first direction, the fourth level being between the fifth level and the third level;
a plurality of fourth resistive change elements each including a seventh terminal and an eighth terminal and disposed between one of the tenth wiring and the eleventh wiring and one of the twelfth wirings, the seventh terminal being electrically connected to the one of the tenth wiring and the eleventh wiring, and the eighth terminal being electrically connected to the one of the twelfth wirings;
a plurality of thirteenth wirings disposed to correspond to the twelfth wirings and extending in the first direction, each of the thirteenth wirings disposed to be in contact with a face of corresponding one of the twelfth wirings opposite to the fourth resistive change elements;
a fourteenth wiring and a fifteenth wiring disposed at a sixth level, extending in the third direction, and separated from each other, the fifth level being between the sixth level and the fourth level, a region between the tenth wiring and the eleventh wiring, a region between the eighth wiring and the ninth wiring, a region between the fourth wiring and the fifth wiring, and a region between the second wiring and the third wiring being located at positions in the second direction from a portion of the fourteenth wiring;
a plurality of fifth resistive change elements each including a ninth terminal and a tenth terminal and disposed between one of the thirteenth wirings and one of the fourteenth wiring and the fifteenth wiring, the ninth terminal being electrically connected to the one of the thirteenth wirings, and the tenth terminal being electrically connected to the one of the fourteenth wiring and the fifteenth wiring;
a sixteenth wiring disposed to be in contact with a face of the fourteenth wiring opposite to the thirteenth wirings and extending in the third direction;

a seventeenth wiring disposed to be in contact with a face of the fifteenth wiring opposite to the thirteenth wirings and extending in the third direction, and separated from the sixteenth wiring;

a plurality of eighteenth wirings disposed at a seventh level and extending in the first direction, the sixth level being between the seventh level and the fifth level;

a plurality of sixth resistive change elements each including an eleventh terminal and a twelfth terminal and disposed between one of the sixteenth wiring and the seventeenth wiring and one of the eighteenth wirings, the eleventh terminal being electrically connected to the one of the sixteenth wiring and the seventeenth wiring, and the twelfth terminal being electrically connected to the one of the eighteenth wirings;

a first contact electrically connected to a portion of the third wiring;

a second contact electrically connected to an end of the ninth wiring on a side of the eighth wiring, and passing through the region between the fourth wiring and the fifth wiring and the region between the second wiring and the third wiring; and a third contact electrically connected to the portion of the fourteenth wiring, and passing through the region between the tenth wiring and the eleventh wiring, the region between the eighth wiring and the ninth wiring, the region between the fourth wiring and the fifth wiring, and the region between the second wiring and the third wiring.

2. The semiconductor memory device according to claim 1, further comprising:

a first driving circuit configured to drive the third wiring through the first contact;

a second driving circuit configured to drive the ninth wiring through the second contact; and a third driving circuit configured to drive the fourteenth wiring through the third contact.

3. The semiconductor memory device according to claim 1, wherein at least one of the first to the sixth resistive change elements contain chalcogenide.

4. The semiconductor memory device according to claim 1, wherein a length of the ninth wiring in the third direction is longer than a length of each of the third wiring and the fifth wiring in the third direction.

5. The semiconductor memory device according to claim 1, wherein one of the first wirings corresponds to one of the sixth wirings, one of the twelfth wirings, and one of the eighteenth wirings in the second direction, wherein one of the seventh wirings corresponds to one of the eighteenth wirings in the second direction, wherein a position of the one of the first wirings is different from a position of corresponding one of the sixth wirings in the first direction and a position of corresponding one of the eighteenth wirings in the first direction, wherein the position of the one of the first wirings is the same as a position of corresponding one of the twelfth wirings in the first direction, and wherein a position of the one of the seventh wirings is the same as a position of corresponding one of the eighteenth wirings in the first direction, and the one of the first wirings is electrically connected to corresponding one of the twelfth wirings through a fourth contact, and the one of the seventh wirings is electrically connected to corresponding one of the eighteenth wirings through a fifth contact.

6. A semiconductor memory device comprising:

a plurality of first wirings disposed at a first level and extending in a first direction;

a second wiring and a third wiring disposed at a second level, a position of which in a second direction intersecting with the first direction is different from that of the first level, the second wiring and the third wiring extending in a third direction that intersects with the first direction and the second direction, and being separated from each other;

a plurality of first resistive change elements each including a first terminal and a second terminal and disposed between one of the first wirings and one of the second wiring and the third wiring, the first terminal being electrically connected to the one of the first wirings, and the second terminal being electrically connected to the one of the second wiring and the third wiring;

a fourth wiring disposed to be in contact with a face of the second wiring opposite to the first wirings and extending in the third direction;

a fifth wiring disposed to be in contact with a face of the third wiring opposite to the first wirings, extending in the third direction, and separated from the fourth wiring;

a plurality of sixth wirings disposed at a third level and extending in the first direction, the second level being between the first level and the third level;

a plurality of second resistive change elements each including a third terminal and a fourth terminal and disposed between one of the fourth wiring and the fifth wiring and one of the sixth wirings, the third terminal being electrically connected to the one of the fourth wiring and the fifth wiring, and the fourth terminal being electrically connected to the one of the sixth wirings;

a plurality of seventh wirings disposed to correspond to the sixth wirings and extending in the first direction, each of the seventh wirings being disposed to be in contact with a face of corresponding one of the sixth wirings opposite to the second resistive change elements;

an eighth wiring and a ninth wiring disposed at a fourth level, extending in the third direction, and separated from each other, the third level being between the fourth level and the second level;

a plurality of third resistive change elements each including a fifth terminal and a six terminal and disposed between one of the seventh wirings and one of the eighth wiring and the ninth wiring, the fifth terminal being electrically connected to the one of the seventh wirings, and the six terminal being electrically connected to the one of the eighth wiring and the ninth wiring;

a tenth wiring disposed to be in contact with a face of the eighth wiring opposite to the seventh wirings and extending in the third direction;

an eleventh wiring disposed to be in contact with a face of the ninth wiring opposite to the seventh wirings and extending in the third direction, and separated from the tenth wiring;

a plurality of twelfth wirings disposed at a fifth level and extending in the first direction, the fourth level being between the fifth level and the third level;

a plurality of fourth resistive change elements each including a seventh terminal and an eighth terminal and disposed between one of the tenth wiring and the eleventh wiring and one of the twelfth wirings, the seventh terminal being electrically connected to the one of the tenth wiring and the eleventh wiring, and the eighth terminal being electrically connected to the one of the twelfth wirings;

a plurality of thirteenth wirings disposed to correspond to the twelfth wirings and extending in the first direction, each of the thirteenth wirings disposed to be in contact with a face of corresponding one of the twelfth wirings opposite to the fourth resistive change elements;

a fourteenth wiring and a fifteenth wiring disposed at a sixth level, extending in the third direction, and separated from each other, the fifth level being between the sixth level and the fourth level, a region between the tenth wiring and the eleventh wiring, a region between the eighth wiring and the ninth wiring, a region between the fourth wiring and the fifth wiring, and a region between the second wiring and the third wiring being located at positions in the second direction from a portion of the fourteenth wiring;

a plurality of fifth resistive change elements each including a ninth terminal and a tenth terminal and disposed between one of the thirteenth wirings and one of the fourteenth wiring and the fifteenth wiring, the ninth terminal being electrically connected to the one of the thirteenth wirings, and the tenth terminal being electrically connected to the one of the fourteenth wiring and the fifteenth wiring;

a sixteenth wiring disposed to be in contact with a face of the fourteenth wiring opposite to the thirteenth wirings and extending in the third direction;

a seventeenth wiring disposed to be in contact with a face of the fifteenth wiring opposite to the thirteenth wirings and extending in the third direction, and separated from the sixteenth wiring;

a plurality of eighteenth wirings disposed at a seventh level and extending in the first direction, the sixth level being between the seventh level and the fifth level;

a plurality of sixth resistive change elements each including an eleventh terminal and a twelfth terminal and disposed between one of the sixteenth wiring and the seventeenth wiring and one of the eighteenth wirings, the eleventh terminal being electrically connected to the one of the sixteenth wiring and the seventeenth wiring, and the twelfth terminal being electrically connected to the one of the eighteenth wirings;

a plurality of nineteenth wirings disposed to correspond to the eighteenth wirings and extending in the first direction, each of the nineteenth wirings disposed to be in contact with a face of corresponding one of the eighteenth wirings opposite to the sixth resistive change elements;

a twentieth wiring and a twenty-first wiring disposed at an eighth level, extending in the third direction, and separated from each other, the seventh level being between the eighth level and the sixth level, a region between the sixteenth wiring and the seventeenth wiring, a region between the fourteenth wiring and the fifteenth wiring, a region between the tenth wiring and the eleventh wiring, a region between the eighth wiring and the ninth wiring, a region between the fourth wiring and the fifth wiring, and a region between the second wiring and the third wiring being located at positions in the second direction from a portion of the twentieth wiring;

a plurality of seventh resistive change elements each including a thirteenth terminal and a fourteenth terminal and disposed between one of the nineteenth wirings and one of the twentieth wiring and the twenty-first wiring, the thirteenth terminal being electrically connected to the one of the nineteenth wirings, and the fourteenth terminal being electrically connected to the one of the twentieth wiring and the twenty-first wiring;

a twenty-second wiring disposed to be in contact with a face of the twentieth wiring opposite to the nineteenth wirings and extending in the third direction;

a twenty-third wiring disposed to be in contact with a face of the twenty-first wiring opposite to the nineteenth wirings and extending in the third direction, and separated from the twenty-second wiring;

a plurality of twenty-fourth wirings disposed at a ninth level and extending in the first direction, the eighth level being between the ninth level and the seventh level;

a plurality of eighth resistive change elements each including a fifteenth terminal and a sixteenth terminal and disposed between one of the twenty-second wiring and the twenty-third wiring and one of the twenty-fourth wirings, the fifteenth terminal being electrically connected to the one of the twenty-second wiring and the twenty-third wiring, and the sixteenth terminal being electrically connected to the one of the twenty-fourth wirings;

a first contact electrically connected to a portion of the third wiring;

a second contact electrically connected to an end of the ninth wiring on a side of the eighth wiring, and passing through the region between the fourth wiring and the fifth wiring and the region between the second wiring and the third wiring;

a third contact electrically connected to an end of the fourteenth wiring on a side of the fifteenth wiring, and passing through the region between the tenth wiring and the eleventh wiring, the region between the eighth wiring and the ninth wiring, the region between the fourth wiring and the fifth wiring, and the region between the second wiring and the third wiring; and a fourth contact electrically connected to the portion of the twentieth wiring, and passing through the region between the sixteenth wiring and the seventeenth wiring, the region between the fourteenth wiring and the fifteenth wiring, the region between the tenth wiring and the eleventh wiring, the region between the eighth wiring and the ninth wiring, the region between the fourth wiring and the fifth wiring, and the region between the second wiring and the third wiring.

7. The semiconductor memory device according to claim 6, further comprising:

a first driving circuit configured to drive the third wiring through the first contact;

a second driving circuit configured to drive the ninth wiring through the second contact;

a third driving circuit configured to drive the fourteenth wiring through the third contact; and a fourth driving circuit configured to drive the twentieth wiring through the fourth contact.

8. The semiconductor memory device according to claim 7, further comprising:

a fifth contact electrically connected to an end of the fifteenth wiring opposite to the fourteenth wiring;

a fifth driving circuit configured to drive the fifteenth wiring through the fifth contact;

a sixth contact electrically connected to a portion of the twenty-first wiring; and a sixth driving circuit configured to drive the twenty-first wiring through the sixth contact.

9. The semiconductor memory device according to claim 8, wherein a length of the fifteenth wiring in the third direction is longer than a length of each of the third wiring and the fifth wiring in the third direction.

10. The semiconductor memory device according to claim 6, wherein at least one of the first to the eighth resistive change elements contain chalcogenide.

11. The semiconductor memory device according to claim 6, wherein a length of the ninth wiring in the third direction is longer than a length of each of the third wiring and the fifth wiring in the third direction.

12. A semiconductor memory device comprising:
a plurality of first wirings disposed at a first level and extending in a first direction;
a second wiring and a third wiring disposed at a second level, a position of which in a second direction intersecting with the first direction is different from that of the first level, the second wiring and the third wiring extending in a third direction that intersects with the first direction and the second direction, and being separated from each other;
a plurality of first resistive change elements each including a first terminal and a second terminal and disposed between one of the first wirings and one of the second wiring and the third wiring, the first terminal being electrically connected to the one of the first wirings, and the second terminal being electrically connected to the one of the second wiring and the third wiring;
a fourth wiring disposed to be in contact with a face of the second wiring opposite to the first wirings and extending in the third direction;
a fifth wiring disposed to be in contact with a face of the third wiring opposite to the first wirings, extending in the third direction, and separated from the fourth wiring;
a plurality of sixth wirings disposed at a third level and extending in the first direction, the second level being between the first level and the third level;
a plurality of second resistive change elements each including a third terminal and a fourth terminal and disposed between one of the fourth wiring and the fifth wiring and one of the sixth wirings, the third terminal being electrically connected to the one of the fourth wiring and the fifth wiring, and the fourth terminal being electrically connected to the one of the sixth wirings;
a plurality of seventh wirings disposed to correspond to the sixth wirings and extending in the first direction, each of the seventh wirings being disposed to be in contact with a face of corresponding one of the sixth wirings opposite to the second resistive change elements;
an eighth wiring and a ninth wiring disposed at a fourth level, extending in the third direction, and separated from each other, the third level being between the fourth level and the second level;
a plurality of third resistive change elements each including a fifth terminal and a six terminal and disposed between one of the seventh wirings and one of the eighth wiring and the ninth wiring, the fifth terminal being electrically connected to the one of the seventh wirings, and the six terminal being electrically connected to the one of the eighth wiring and the ninth wiring;
a tenth wiring disposed to be in contact with a face of the eighth wiring opposite to the seventh wirings and extending in the third direction;
an eleventh wiring disposed to be in contact with a face of the ninth wiring opposite to the seventh wirings and extending in the third direction, and separated from the tenth wiring;
a plurality of twelfth wirings disposed at a fifth level and extending in the first direction, the fourth level being between the fifth level and the third level;
a plurality of fourth resistive change elements each including a seventh terminal and an eighth terminal and disposed between one of the tenth wiring and the eleventh wiring and one of the twelfth wirings, the seventh terminal being electrically connected to the one of the tenth wiring and the eleventh wiring, and the eighth terminal being electrically connected to the one of the twelfth wirings; and
a first contact electrically connected to a portion of the eighth wiring, and passing through a region between the fourth wiring and the fifth wiring and a region between the second wiring and the third wiring.

13. The semiconductor memory device according to claim 12, further comprising:
a second contact electrically connected to a portion of the third wiring; and
a first driving circuit configured to drive the eighth wiring through the first contact; and
a second driving circuit configured to drive the third wiring through the second contact.

14. The semiconductor memory device according to claim 12, wherein at least one of the first to the fourth resistive change elements contains chalcogenide.

* * * * *